United States Patent [19]

Russell et al.

[11] Patent Number: 5,671,125
[45] Date of Patent: Sep. 23, 1997

[54] VERTICAL PACKAGE MOUNTED ON BOTH SIDES OF A PRINTED CIRCUIT BOARD

[75] Inventors: Ernest Russell, Richmond; Daniel Baudouin, Missouri City; James S. Wallace, Sugar Land, all of Tex.

[73] Assignee: Texas Instruments Incorporated, Dallas, Tex.

[21] Appl. No.: 517,308

[22] Filed: Aug. 21, 1995

Related U.S. Application Data

[63] Continuation of Ser. No. 241,824, May 12, 1994, abandoned.

[51] Int. Cl.⁶ .................. H05K 7/02; H05K 1/16
[52] U.S. Cl. .................. 361/760; 361/764; 361/772; 361/777; 361/783; 174/260; 174/262; 174/267
[58] Field of Search .................. 361/760–761, 361/763–765, 767, 770, 772–774, 777–779, 782–783, 785, 789–790, 791, 804, 813, 807–810; 174/260–262, 265–267; 257/678, 685–686, 690–693, 698, 723–724

[56] References Cited

U.S. PATENT DOCUMENTS

| | | |
|---|---|---|
| 4,546,406 | 10/1985 | Spinelli et al. . |
| 4,750,089 | 6/1988 | Derryberry et al. . |
| 4,855,809 | 8/1989 | Malhi et al. . |
| 4,963,697 | 10/1990 | Peterson et al. .......... 174/252 |
| 4,967,042 | 10/1990 | Shepherd et al. .......... 174/250 |
| 4,967,262 | 10/1990 | Farnsworth . |
| 4,974,057 | 11/1990 | Tazima . |
| 4,975,763 | 12/1990 | Baudouin et al. . |
| 4,979,015 | 12/1990 | Stierman et al. . |
| 4,982,268 | 1/1991 | Schuerman . |
| 4,994,896 | 2/1991 | Uemura et al. . |
| 5,059,557 | 10/1991 | Cragon et al. .......... 437/208 |
| 5,080,611 | 1/1992 | Hypes . |
| 5,260,601 | 11/1993 | Baudouin et al. .......... 257/678 |
| 5,352,851 | 10/1994 | Wallace et al. .......... 174/52.4 |

FOREIGN PATENT DOCUMENTS

| | | |
|---|---|---|
| 0427151 | 5/1991 | European Pat. Off. . |
| 0587294 | 3/1994 | European Pat. Off. . |

*Primary Examiner*—Bot L. Ledynh
*Attorney, Agent, or Firm*—W. Daniel Swayze, Jr.; W. James Brady, Jr.; Richard L. Donaldson

[57] ABSTRACT

Two flat packages (110, 111) are arranged to achieve a mirrored footprint by employing guides (100), which are positioned within a mounting aperature a printed circuit board. The flat packages include leads (120, 121) which extend from an edge of the flat package. A semiconductor chip is encapsulated by the flat packages.

11 Claims, 3 Drawing Sheets

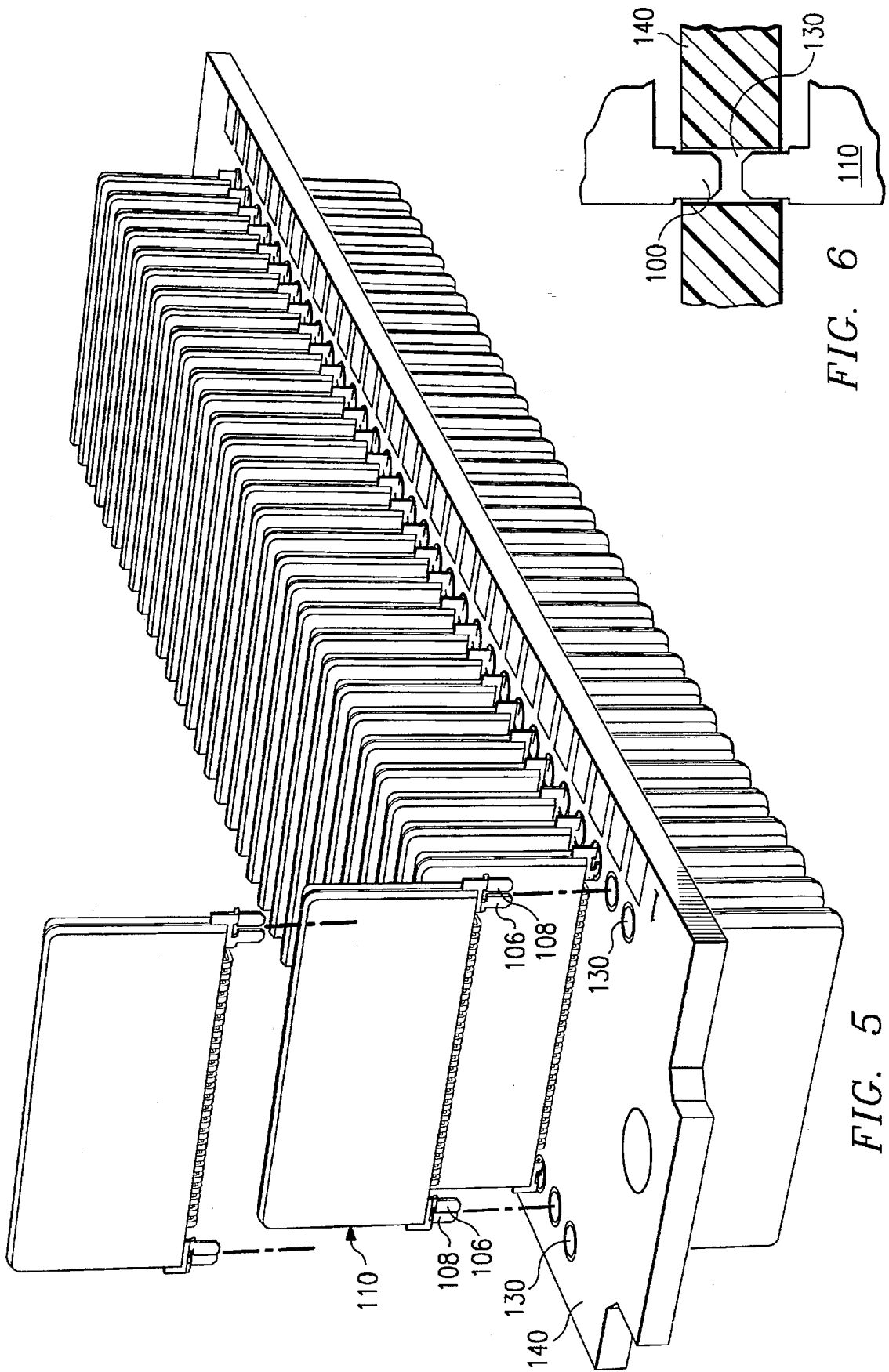

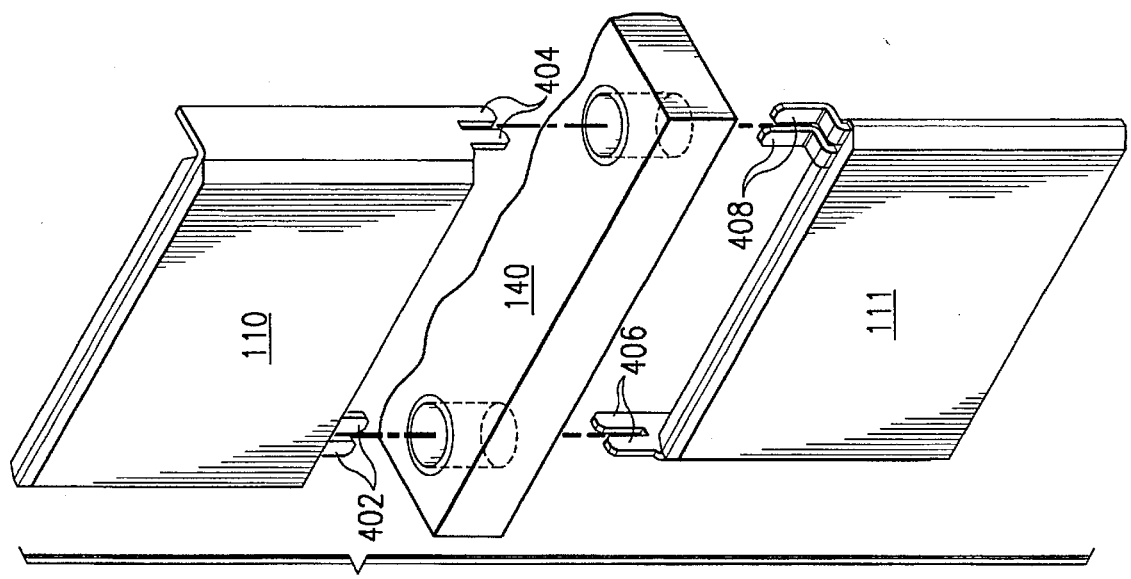
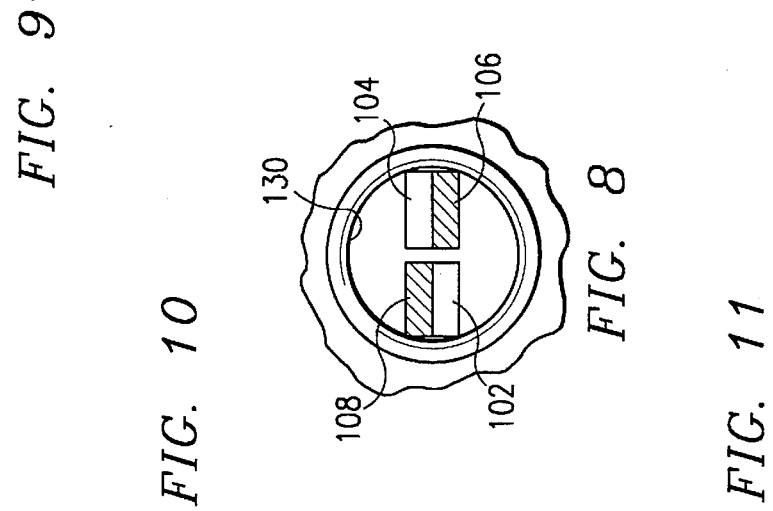
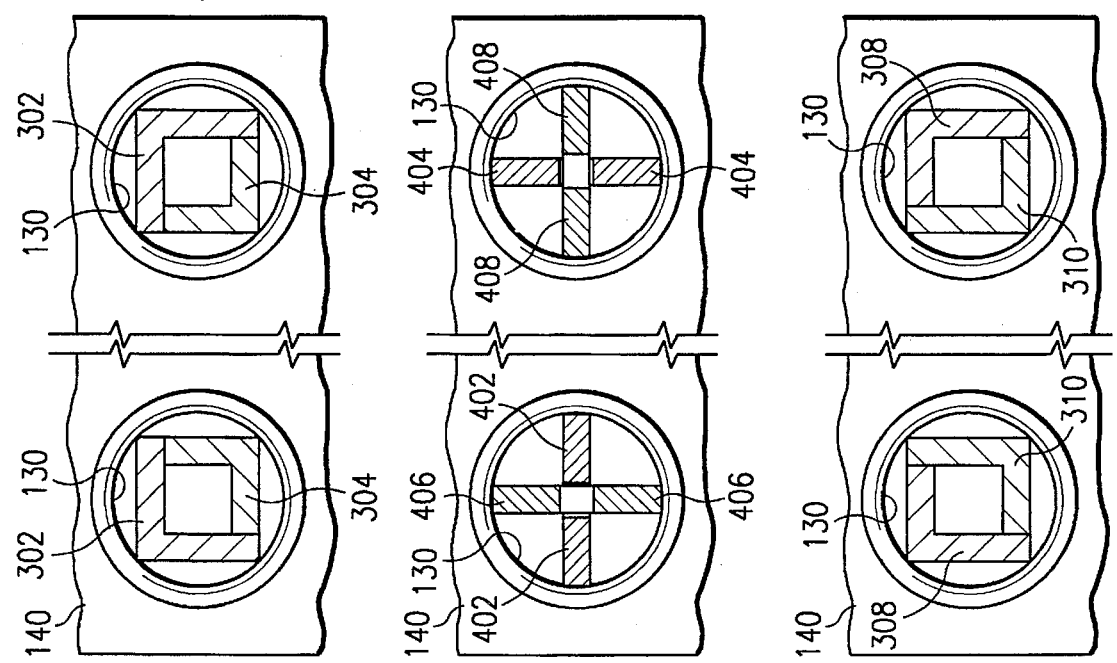

VERTICAL PACKAGE MOUNTED ON BOTH SIDES OF A PRINTED CIRCUIT BOARD

This application is a Continuation of application Ser. No. 08/241,824, filed May 12, 1994, now abandoned.

TECHNICAL FIELD OF THE INVENTION

This invention relates to semiconductors and, more particularly, to surface-mounted packages for integrated circuit devices.

BACKGROUND OF THE INVENTION

Integrated circuit devices have been housed in dual-in-line plastic packages, referred to as DIP packages, for many years in semiconducting manufacturer. These DIP packages have leads extending through holes in a printed circuit board, and the package itself is mounted flat on the board. More recently, surface-mount packaging has been introduced, and this technique eliminates the necessity of soldering leads in holes in the PC boards, so the leads and the PC board connectors can be closer together achieving higher densities.

Similarly, edge-mounted packages or modules have been used in an effort to further increase the density of devices, improving cooling and reducing cost.

U.S. Pat. No. 5,260,601 to Baudouin et al. discloses a pair of protruding studs or spacers, positioned on the same edge of a flat package as the leads. These studs or spacers are composed of molded plastic and are formed at the same time as the package itself. The spacers include a reduced-diameter cylindrical portion for insertion into holes in the printed circuit board where the device is to be mounted and include lip or stop portions co-planar with the flat surfaces of the leads so that the leads will be positioned for soldering to the conductors on the printed circuit board.

SUMMARY OF THE INVENTION

The present invention provides an edge-mounted or surface mounted device with respect to the package or the printed circuit board. The present invention provides a device that can be packed with a very high packing density and achieves a low profile. The high pacing density is achieved by packages being positioned on both sides of the printed circuit board, eliminating the need for two printed circuits boards. Additionally, the layout of the board is simplified because devices mirror each other by rotation.

The present invention includes a pair of semiconductor integrated semiconductor devices including a first semiconductor integrated circuit device having a first flat package encapsulating a first semiconductor chip, a plurality of first leads extending from one edge of the flat packages, a first guide extending from one edge of the first flat package shaped to fit into a mounting aperature for mechanically positioning and supporting the first flat package when the first conductive leads are soldered in position, a second semiconductor integrated circuit device having an identical or similar second flat package encapsulating a second semiconductor chip, a plurality of second conductive leads extending from one edge of the second flat package, a second guide extending from the one edge of the second flat package that is shaped to fit the aperture for mechanically positioning and supporting the second flat package when the leads are soldered.

DESCRIPTION OF THE DRAWINGS

For a more complete understanding of the present invention and for further advantages thereof, references now made to the following detailed description taken in conjunction with the accompanying drawings in which:

FIG. 5 illustrates a perspective view of a plurality of flat packages positioned on both sides of a printed circuit board;

FIG. 6 illustrates a section view of the first embodiment guides and PC board of the present invention with stud style guides, each extending one-half thickness into PC board;

FIG. 7 illustrates a top view of a third embodiment of the guides within the mounting hole of the printed circuit board with formed angle style guides, shaped to allow guides to pass from either side of PC board with full thickness extention;

FIG. 8 illustrates a top view of the guides within the mounting hole with split tab style guides, shaped to allow guides to interlock within PC board mounting hole;

FIG. 9 illustrates a perspective view of the flat package and a fourth embodiment of guides of the present invention with split tab style guides, oriented to allow interlocking guides within PC board mounting hole;

FIG. 10 illustrates a top view of additional guides within the mounting hole with formed angle style guides; and FIG. 11 illustrates a top view of additional fourth embodiment of guides within the mounting hole.

DETAILED DESCRIPTION OF THE INVENTION

Figure 1:
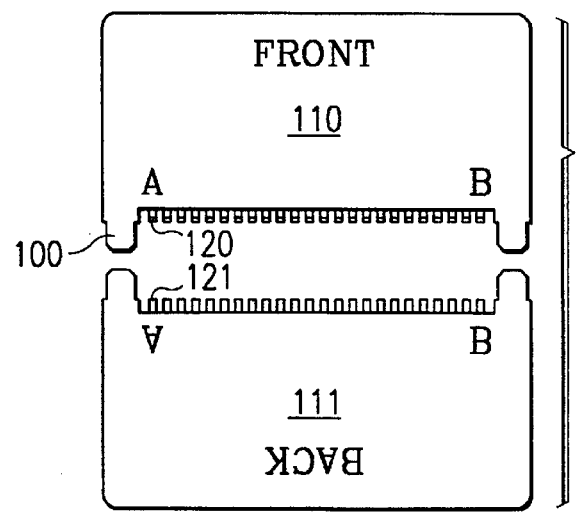
FIG. 1 illustrates a plan view of a flat package which normally will be vertically surface mounted on edge with guides.
Figure 2:
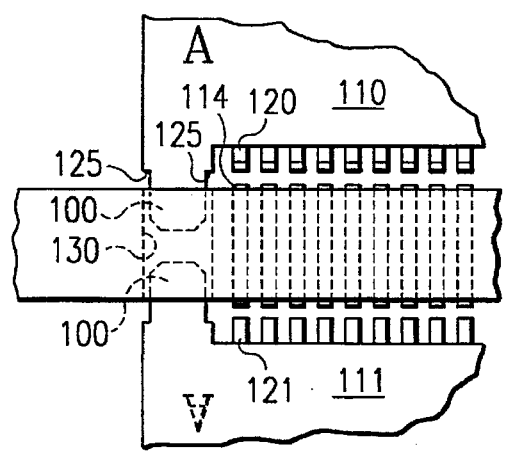
FIG. 2 illustrates a sectional view of the flat package and a first embodiment of the guides with the printed circuit board.

As illustrated in FIG. 1, two flat packages 110, in for encapsulating an integrated circuit device (not shown) which is connected to the printed circuit board having a length, a width and a depth by the lead frames 120 by soldered connections 114 through via S to both devices (not shown). These lead frames 120 may be connected to bumps on the integrated circuit chip. Alternatively, the leads may be connected to bonding pads on the integrated circuit chip. The leads are properly aligned by guides in the apertures to provide for connection to the upright flat package 110 which is positioned with respect to the inverted flat package 111 such that a mirrored foot print of the lead frames 120 is obtained. The mirrored footprint is obtained by employing a printed circuit board having the same connection configuration on one side as the other side of the printed circuit board and having the same configuration of the pins in that a particular pin on the upright flat package 120 is opposite to the same pin on the inverted flat package 121. FIG. 2 further illustrates this aspect of the present invention in that connection 114 connects both leadframe 120 of the upright flat package 120 to connection 114 and leadframe 121 of the inverted flat package 111 to connection 114.

Thus flat packages that may be positioned on the printed circuit board in accordance with this mirrored footprint resulting in a simple and inexpensive printed circuit board.

FIG. 2 illustrates one arrangement of guides 100, which achieve the mirrored foot print. The guide 100 guides and secures the flat package 110 by wedging the guide 100 against the surface of the mounting aperature 130. These guides 100 are of such a length such that the flange 125 is a stop for the guide 100 by abutting the printed circuit board. The flange 125 is positioned on guide 100 such that the flange 125 stops the guide 100 in the aperture, preventing the guide 100 from abutting or overlapping with the guide of the opposing flat package 111. The flanges 125 are additionally positioned such that the lead frames 120 connect with the connection 125 of the printed circuit board.

FIG. 6 illustrates that the guides 100 are positioned within the mounting aperature 130 in the printed circuit board and that the flange 125 abuts the printed circuit board, preventing the overlap of the guides in the printed circuit board.

Figure 3:
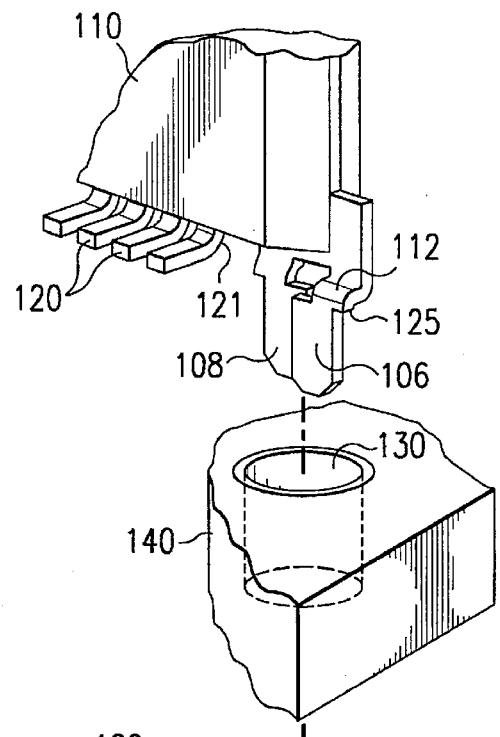
FIG. 3 illustrates a perspective view of the flat package with a second embodiment of the guides and an aperture of the printed circuit board.

FIG. 3 illustrates another embodiment of the present invention where the guides may be metal integral with the lead frame. In this embodiment, the guides of the upright flat package 110 are of a sufficient length to abut and overlap the guides of the inverted flat package 111. The guides for example guides 102 and 104 are positioned to be parallel with respect to each other and the length of the flat package yet to be offset such that guide 102 is staggered with respect to guide 104. For example, the forward guide 102 of the inverted flat package is in a first plane while the rearward guide 104 of the inverted flat package is in a second plane. The first and second planes are substantially parallel for example within 10 degrees of each other. Additionally, the forward guide 106 and the rearward guide 108 are similarly parallel offset and staggered with respect to each other. This staggered positioning of forward and reverse guides for the inverted and upright flat package respectively achieves the mirrored footprint since any arrangement of the inverted and upright flat packages not achieving the mirrored footprint would result in the distal end of guides 102 and 104 of the inverted mounting package in the mounting aperature 130 abutting the distal end of the guides 106 and 108 of the upright mounting package, preventing the flange 125 from abutting the surface of the printed circuit board and the lead frames 120 from connecting with connections 114. The guides 102, 104, 106, 108 securely position the flat packages 110, 111 by wedging the guides 102, 104, 106, 108 against one another and against the surface of the mounting aperature 130 when the mirrored footprint has been achieved.

FIG. 8 illustrates the guides 102, 104, 106 and 108 within the mounting aperature 130 of the printed circuit board 140. Since the length of each of these guides are greater than one-half the depth of the printed circuit board, the guides overlap and are staggered as illustrated.

The upright and inverted flat package (FIG. 3) 110 and 111 include flange 125 to stop the guide within the mounting aperature 130. The flange 125 is positioned so that the lead frame 120 abuts the connection 114 of the printed circuit board to complete a connection with the printed circuit board. Additionally, the flange 125 when abutting the printed circuit board, positions the guides 102, 104, 106, 108 in the overlapped position.

Figure 4:
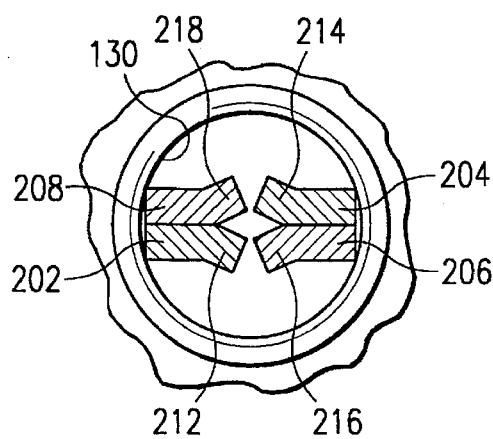
FIG. 4 illustrates a top view of the mounting hole of the printed circuit board and guides with split and spring-formed style guides, shaped to allow interlocking guides to provide positive support.

FIG. 4 illustrates another embodiment of the present invention. The forward guide 202 for the inverted flat package may include an inclined portion 212 to abut an inclined portion 218 of the rearward guide 208 of the upright flat package. Likewise, the forward guide 206 abut of the upright flat package includes an inclined portion 216 to abut an inclined portion 214 of the guide 204 of the rearward flat package. The inclined portion 212 facilitates the abutment of the inclined portion 218 to securely wedge the guide against the surface of the mounting aperature. The inclined portion 216 facilitates the abutment of the inclined portion 214.

As illustrated in FIG. 5, a plurality of flat packages may be mounted on one side of a printed circuit board 140 and a second plurality of flat packages may be mounted on the opposing side of the printed circuit board 140. This provides for an efficient and high density positioning of the flat packages.

FIG. 7 illustrates another embodiment of the present invention. FIG. 7 illustrates two L-shaped guides in mounting aperature 130. L-shaped guide 302 of the upright flat package abuts with the L-shape guide 304 of the inverted flat package. Both L-shaped guides 302 and 304 abuts with the surface of the mounting aperature to position and secure the flat package on the printed circuit board. FIG. 7 illustrates that guide 302 is smaller than guide 304.

FIG. 10 illustrates that L-shaped guides 308 are of equal size to L-shaped guides 310. The use of the L-shape guides 302 and 304 does not assure that the mirrored footprint is achieved.

FIG. 9 illustrates another embodiment of the present invention. The flat package 110 includes two parallel guides 402 and two perpendicular guides 404. The parallel guides 402 are substantially parallel and in the same plane as the length of the flat package 110. Furthermore, the perpendicular guides 404 are substantially in the same plane but perpendicular to the length of the flat package. FIG. 11 additionally illustrates that the parallel guides 402 of the upright flat package abut the perpendicular guides 406 of the inverted flat package. Additionally, the perpendicular guides 404 of the upright package abut the parallel guide 408 of the inverted flat package. This does achieve the mirrored footprint.

The above mentioned guides of the present invention may be integrated with the package or lead frame or formed with the flat package after manufacture.

OTHER EMBODIMENTS

Although the present invention and its advantages have been described in detail, it should be understood that various changes, substitutions and alterations can be made herein without departing from the spirit and scope of the invention as defined by the appended claims.

What is claimed is:

1. A surface mounted integrated circuit structure comprising:

a printed circuit board having a surface, the surface having mounting apertures, a first semiconductor integrated circuit device having a first flat package encapsulating a first semiconductor chip, a plurality of first conductive leads extending from one edge of said first flat package, first guides extending from the said one edge of said first flat package and shaped to fit into said apertures of said printed circuit board for mechanically positioning and supporting said first flat package when the first conductive leads are soldered to said printed circuit board;

a second integrated circuit device having a second flat package encapsulating a second semiconductor chip, a plurality of second conductive leads extending from one edge of said second flat package, second guides extending from the said one edge of the second flat package and shaped to fit into said same apertures as said first guides for mechanically positioning and supporting the package when said second conductive leads are soldered to said printed circuit board wherein said first and second guides having a length less than a depth of the apertures.

2. A surface mounted integrated circuit structure as in claim 1, wherein said first and second guides are substantially L-shaped.

3. A surface mounted integrated circuit structure as in claim 1, wherein said first guide includes third guide parallel to a length of the flat package and fourth guides perpendicular to said length of the flat package.

4. A surface mounted integrated circuit structure comprising:

printed circuit board having a surface, the surface having mounting apertures, a first semiconductor integrated circuit device having a first flat package encapsulating a first semiconductor chip, a plurality of first conductive leads extending from one edge of said first flat package, first guides extending from the said one edge of said first flat package and shaped to fit into said apertures of said printed circuit board for mechanically positioning and supporting said first flat package when the first conductive leads are soldered to said printed circuit board;

a second integrated circuit device having a second flat package encapsulating a second semiconductor chip, a plurality of second conductive leads extending from one edge of said second flat package, second guides extending from the said one edge of the second flat package and shaped to fit into said same apertures as said first guides for mechanically positioning and supporting the package when said second conductive leads are soldered to said printed circuit board, wherein said first and second guides are positioned in said mounting apertures such that said first conductive leads form a mirrored footprint with respect to said second conductive leads.

5. A surface mounted integrated circuit structure comprising:

a printed circuit board having a surface, the surface having mounting apertures, a first semiconductor integrated circuit device having a first flat package encapsulating a first semiconductor chip, a plurality of first conductive leads extending from one edge of said first flat package, a pair of first offset guides extending from the said one edge of said first flat package and shaped to fit into said apertures of said printed circuit board for mechanically positioning and supporting said first flat package when the first conductive leads are soldered to said printed circuit board;

a second integrated circuit device having a second flat package encapsulating a second semiconductor chip, a plurality of second conductive leads extending from one edge of said second flat package, a pair of second offset guides extending from the said one edge of the second flat package and shaped to fit into said same apertures as said first offset guides for mechanically positioning and supporting the package when said second conductive leads are soldered to said printed circuit board, wherein said first offset guides and said second offset guides are engaged so as to wedge said first and second offset guides within said mounting apertures.

6. A pair of semiconductor integrated circuit devices comprising:

a first semiconductor integrated circuit device having a first flat package encapsulating a first semiconductor chip, a plurality of first conductive leads extending from one edge of said first flat package, a first guide extending from said one edge of said first flat package shaped to fit into an aperture for mechanically positioning and supporting said first flat package when said first conductive leads are soldered in position; and a second semiconductor integrated circuit device having a second flat package encapsulating a second semiconductor chip, a plurality of second conductive leads extending from one edge of the second flat package, a second guide extending from said one edge of said second flat package that are shaped to fit in said same aperture as the first guide for mechanically positioning and supporting said second flat package when the leads are soldered, wherein said first and second guides have a length less than a depth of the apertures.

7. A pair of semiconductor integrated circuit devices as in claim 6, wherein said first and second guides are substantially L-shaped.

8. A pair of semiconductor integrated circuit devices as in claim 6, wherein said first guide includes third guide parallel to a length of the flat package and fourth guides perpendicular to said length of the flat package.

9. A pair of semiconductor integrated circuit devices comprising:

a first semiconductor integrated circuit device having a first flat package encapsulating a first semiconductor chip, a plurality of first conductive leads extending from one edge of said first flat package, a first guide extending from said one edge of said first flat package shaped to fit into an aperture for mechanically positioning and supporting said first flat package when said first conductive leads are soldered in position; and a second semiconductor integrated circuit device having a second flat package encapsulating a second semiconductor chip, a plurality of second conductive leads extending from one edge of the second flat package, a second guide extending from said one edge of said second flat package that are shaped to fit in said same aperture for mechanically positioning and supporting said second flat package when the leads are soldered, wherein said first and second guides are positioned in said aperture such that said first conductive leads form a mirrored footprint with respect to said second conductive leads.

10. A pair of semiconductor integrated circuit devices comprising:

a first semiconductor integrated circuit device having a first flat package encapsulating a first semiconductor chip, a plurality of first conductive leads extending from one edge of said first flat package, a pair of first offset guides extending from said one edge of said first flat package shaped to fit into an aperture for mechanically positioning and supporting said first fist package when said first conductive leads are soldered in position; and a second semiconductor integrated circuit device having a second flat package encapsulating a second semiconductor chip, a plurality of second conductive leads extending from one edge of the second flat package, a pair of second offset guides extending from said one edge of said second flat package that are shaped to fit in said same aperture as the first offset guides for mechanically positioning and supporting said second flat package when the leads are soldered, wherein said first offset guides and said second offset guides are engaged to wedge said first and second offset guides within said aperture.

11. A surface mounted integrated circuit structure comprising:

a printed circuit board having a surface, the surface having mounting apertures, a first semiconductor integrated circuit device having a first flat package encapsulating a first semiconductor chip, a plurality of first conductive leads extending from one edge of said first flat package, first guides extending from the said one edge of said first flat package and shaped to fit into said apertures of said printed circuit board for mechanically positioning and supporting said first flat package when the first conductive leads are soldered to said printed circuit board;

a second integrated circuit device having a second flat package encapsulating a second semiconductor chip, a plurality of second conductive leads extending from one edge of said second flat package, second guides extending from the said one edge of the second flat package and shaped to fit into said same apertures as said first guides for mechanically positioning and supporting the package when said second conductive leads are soldered to said printed circuit board wherein said first and second guides having a length less than a depth of the apertures and wherein the first and second guides are integral with the first and second flat packages respectively.

* * * * *